United States Patent [19]
Thierry

[11] Patent Number: 5,473,553
[45] Date of Patent: Dec. 5, 1995

[54] FREQUENCY DIVIDING DEVICE

[75] Inventor: Thomas Thierry, Grenoble, France

[73] Assignee: Commissariat A l'Energie Atomique, Paris, France

[21] Appl. No.: 222,931

[22] Filed: Apr. 5, 1994

[30] Foreign Application Priority Data

Apr. 20, 1993 [FR] France ................................ 93 04623

[51] Int. Cl.$^6$ ................................................ H03K 21/00
[52] U.S. Cl. ................................................ 364/703; 377/48
[58] Field of Search ................................ 364/703; 377/48; 327/117

[56] References Cited

U.S. PATENT DOCUMENTS

| 4,144,489 | 3/1979 | Ward et al. | 324/78 D |
| 4,413,350 | 11/1983 | Bond et al. | 364/703 |
| 4,556,984 | 12/1985 | Genrich | 377/47 |
| 4,991,188 | 2/1991 | Perkins | 377/48 |
| 5,088,057 | 2/1992 | Amrany et al. | 364/703 |
| 5,235,531 | 8/1993 | Foerg | 364/703 |
| 5,255,213 | 10/1993 | Wasserman | 364/703 |
| 5,287,296 | 2/1994 | Bays et al. | 364/703 |

FOREIGN PATENT DOCUMENTS 0445979 9/1991 European Pat. Off. .

Primary Examiner—David H. Malzahn
Attorney, Agent, or Firm—Burns, Doane, Swecker & Mathis

[57] ABSTRACT

The invention relates to a device for dividing an input signal of frequency f1 by a parametrized number of ratio M/m in order to supply an output signal of frequency f2. This device performs a cycle stealing division process and has means for choosing the cycles to be masked or concealed in the signal of frequency f1, in order to supply a signal of frequency f2 having minimum amplitude phase jumps.

9 Claims, 4 Drawing Sheets

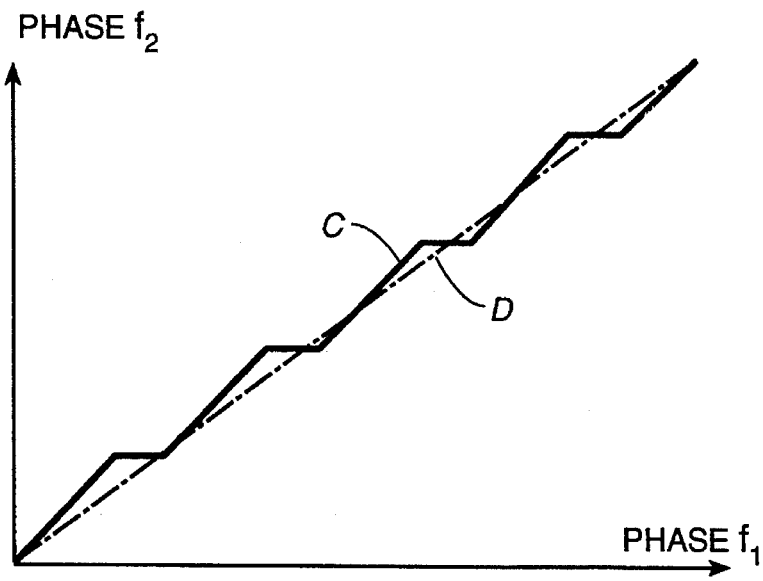
FIG._1
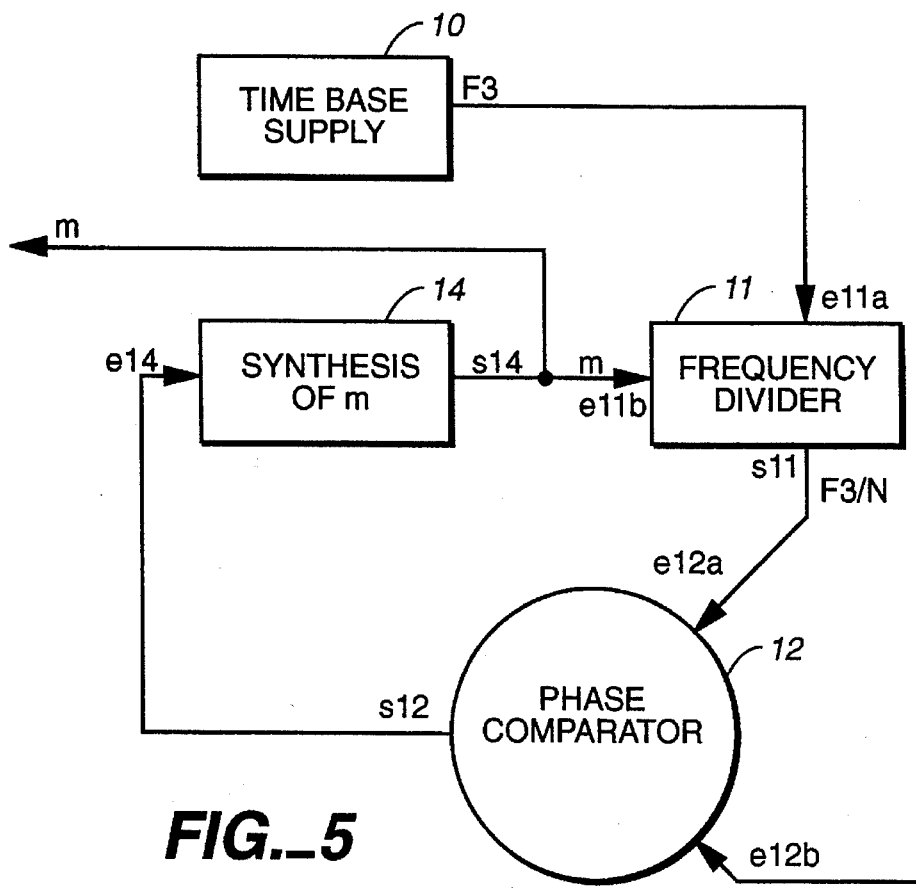
FIG._5

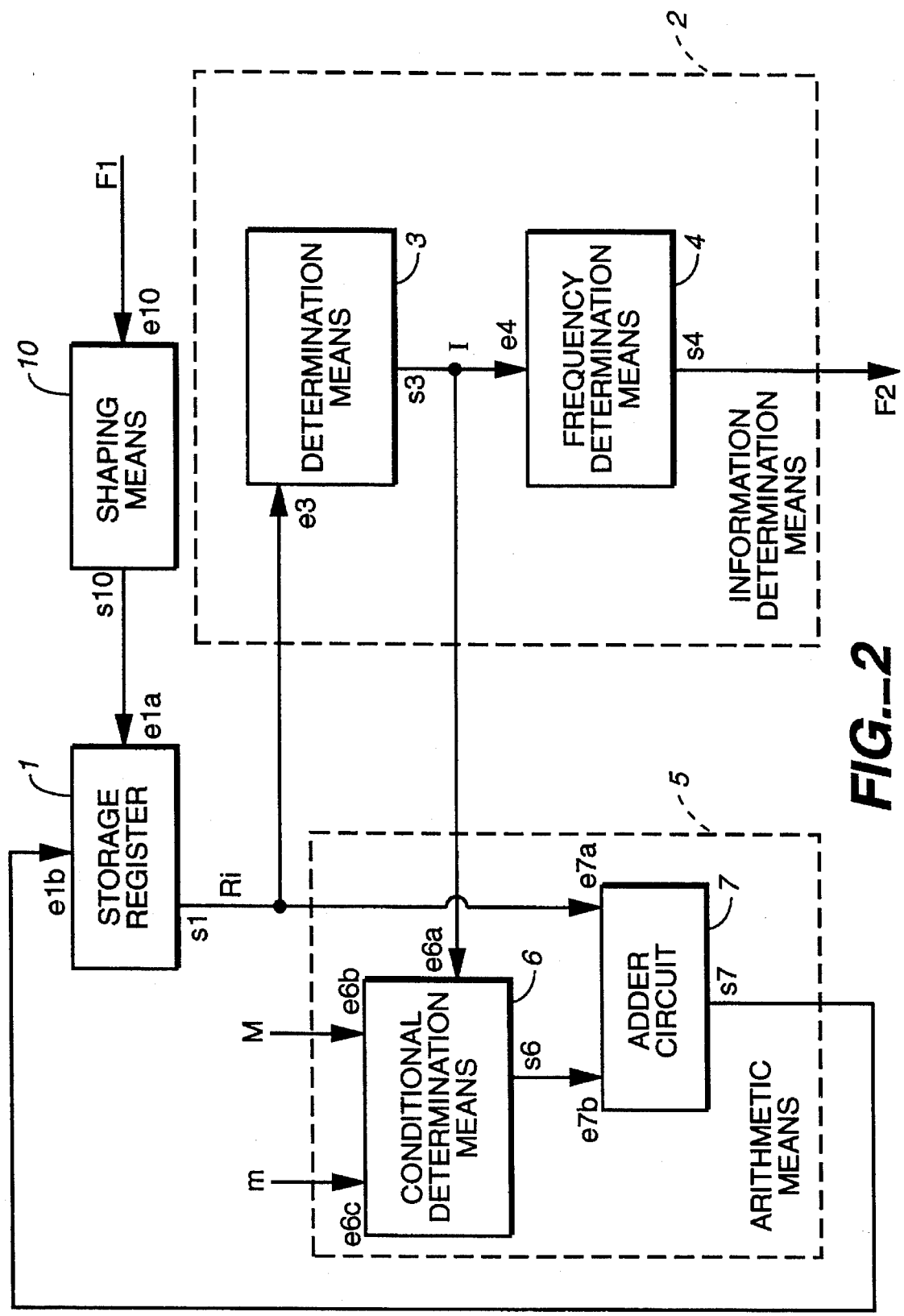
FIG._2

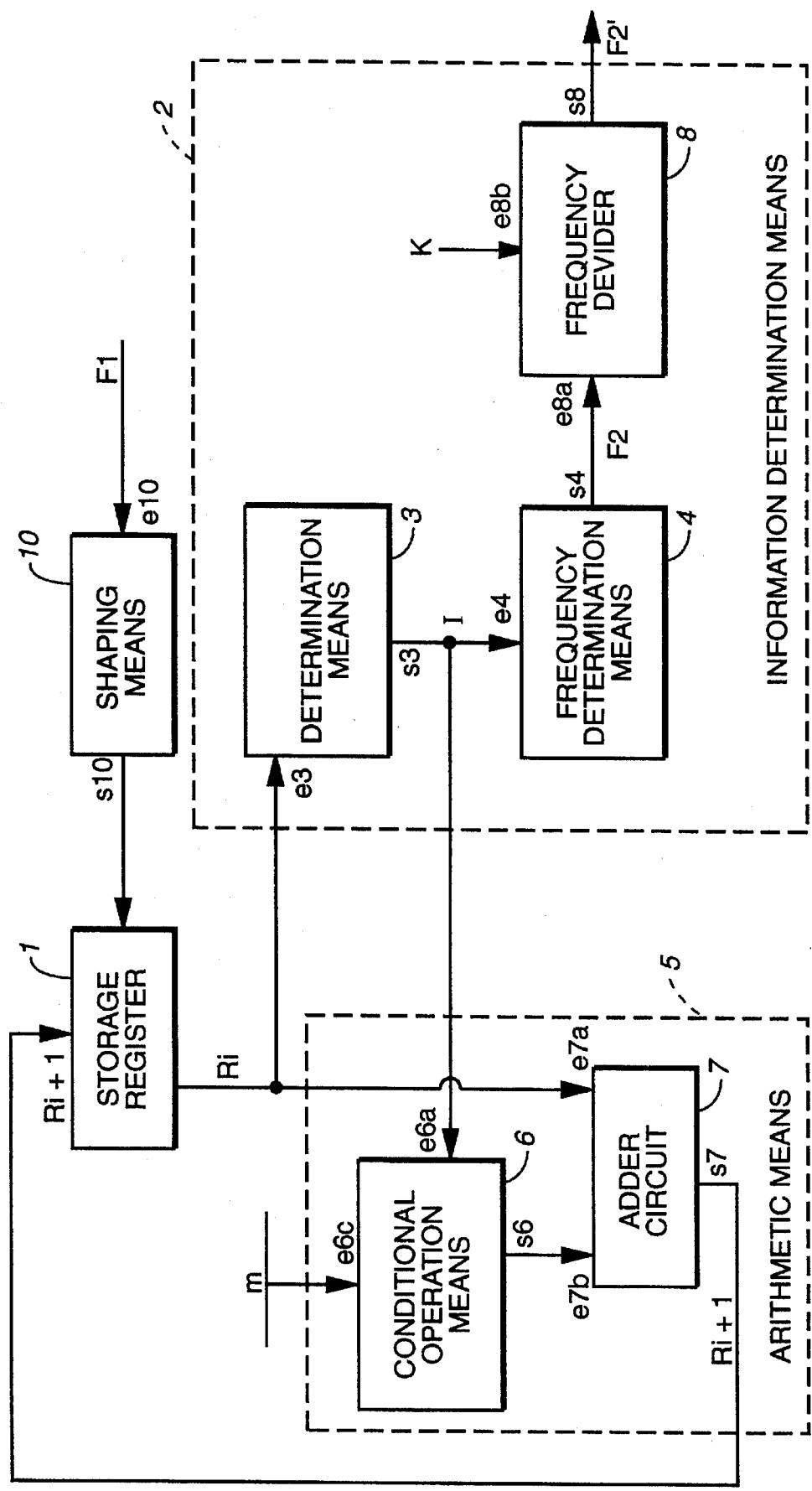
FIG._3

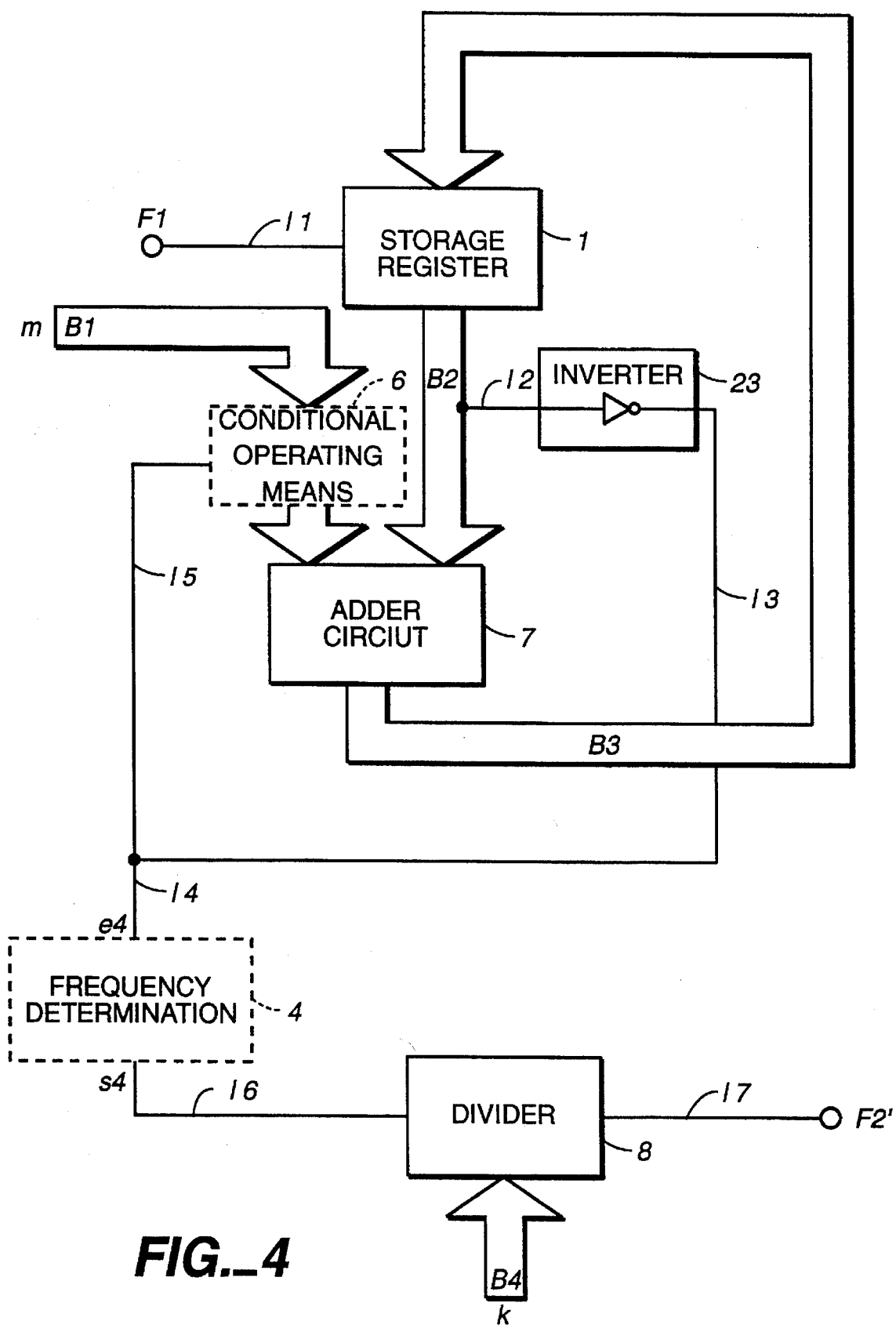
FIG._4

FREQUENCY DIVIDING DEVICE

TECHNICAL FIELD

The present invention relates to a frequency dividing device or more simply frequency divider. It has numerous applications in the electronics and signal processing fields.

PRIOR ART

There are numerous frequency divider types which are known from the prior art.

A first frequency divider type is the division device based on counting. Such a device has a counter making it possible to regularly identify N periods or cycles of a signal of frequency f1 by supplying an event for each cycle. The signal resulting from this operation is of frequency f2. Such a device suffers from the disadvantage of only permitting a division ratio f1/f2=N of integral value. Therefore this device has a division ratio of very limited accuracy.

A second frequency divider type is of the phase locked loop or PLL type. Such a divider is described in the publication of Texas Instruments entitled "Digital phase-locked loop filters", pp 3807 to 3812. The device described has a looped circuit making it possible to compare the phase of an internal signal of frequency f1* with the phase of an incident signal of frequency f1 and modify the frequency f1* of the internal signal in order to adjust it to the frequency f1 of the incident signal, so that the phase difference between these two signals remains constant whatever the modifications of the frequency f1. This device has an internal oscillator of frequency fo controlled by said phase difference. The internal signal of frequency f1* is obtained by a first division by counting the ratio M of the signal of frequency fo. As the frequencies f1 and f1* are equivalent m:f1=f1*=fo/M. The signal of frequency f2 from the PLL frequency divider is obtained by a second division by counting the ratio N by which f2=fo/N. The signal of frequency f2 obtained at the output of the PLL divider, based on the signal of frequency f1, is therefore expressed in the form f1/f2=N/M, in which N/M is the division ratio of this device.

Such a device suffers from the disadvantage of being difficult to construct, particularly as a result of the phase dependence stability conditions involved. For a good construction of this device, the value M must not exceed one hundred, which limits the accuracy of the frequency ratio which can be obtained.

A third type of frequency divider is the cycle stealing divider. This device uses a cycle stealing process consisting of dividing a signal of frequency f1 by concealing or masking portions of the signal, i.e. by eliminating certain periods or cycles thereof. The thus obtained signal has a mean frequency f2 below the frequency f1. These eliminated cycles give rise to effects known as "phase jumps" and make the signal of frequency f2 irregular. For most of these devices, the number of concealed cycles is N-M. These cycles are concealed every N cycles of the signal of frequency f1, in which M represents the number of remaining cycles corresponding to the signal of frequency f2 with M<N. The division ratio of this device is then equivalent to N/M.

Such a device has two counters in series, a first counter for counting the number of cycles to be concealed and a second counter for regenerating the operation of the first counter every N cycles of the signal of frequency f1.

This device has the disadvantage of phase jumps which can be of a significant magnitude (i.e. have a high amplitude) when N is high compared with M. Such phase jumps may not be tolerated by the device to which the signal at frequency f2 resulting from the frequency division is applied.

DESCRIPTION OF THE INVENTION

The aim of the present invention is to obviate these disadvantages. To this end, it proposes a cycle stealing frequency dividing device, in which the choice of the cycles to be concealed takes place in a very precise manner, so that the division ratio can be very precise, whilst having reduced phase jumps.

More specifically, the invention relates to a device for dividing an electric signal of frequency f1 by a number of ratio M/m in order to supply an electric signal of frequency f2, in which the frequency f2 is below the frequency f1, characterized by:

shaping means receiving a signal of frequency f1 and able to emit a logic periodic signal at said frequency f1, means for storing iterative values (. . . Ri, Ri+1, . . . ) having a first input connected to the shaping means in order to receive the periodic signal emitted at the frequency f1, information determination means having an input connected to an output of the storage means for receiving the iterative value Ri stored in said storage means, said determination means being able, on the one hand, to determine the polarity sign of the iterative value and convert said polarity sign into a binary information which can be in a first or second state, said information being supplied to a first output and, on the other hand, determine a frequency signal on the basis of this information relative to the iterative value, arithmetic means comprising:

a conditional operation circuit able to receive on a first input connected to the first output of the determination means, the said binary information, on a second input the value m and optionally on a third input the value M and able to supply on an output, either the value m-M, or the value m as a function of the binary information state, and an adder circuit able to receive on a fourth input connected to the output of the storage means, the iterative value and on a fifth input connected to the output of the conditional operation circuit the value m-M or m, and supply for each period of the frequency signal a new iterative value (Ri+1) transmitted to the storage means by an output connected to a second input of said storage means.

Advantageously, the information determination means incorporate a first logic circuit able to determine the polarity sign of the iterative value Ri and convert said polarity sign into a binary information I which can be in a first or second state. They incorporate a second logic circuit able to determine the frequency at which the binary information is in its first state, said frequency corresponding to the frequency f2.

According to an embodiment of the invention, the number M/m is a parametrized value, in which each of the values M and m are parametrized values.

According to this embodiment, the conditional operation circuit has a circuit able to perform a subtraction of the values m and M. This circuit is either an adder, in which case it receives on its inputs the values m and −M, or a subtracter, in which case it receives on its inputs the values m and M, said adder or subtracter being associated with a data bus selector.

According to another embodiment of the invention, the ratio M/m is a parametrized value, in which m is a parametrized value and M is a particular, previously defined value. In this case, the value M is advantageously binary coded in such a way as to have a state 1 for the sign bit and states 0 for all the other bits. In this way, the conditional circuit no longer requires a subtracter or adder.

According to this embodiment, the conditional operation circuit has a circuit able to select, as a function of the information I, the modification or non-modification of the sign of m, in order to supply at the output of the conditional operation circuit the value of m with a possibly modified sign.

Advantageously, the device according to the invention can also comprise a frequency dividing circuit having an input connected to the output of the determination means and ensuring a division of the frequency f2 obtained at the output of said determination means by an integral number K so as to have a division ratio (M×K)/m.

BRIEF DESCRIPTION OF THE DRAWINGS

FIG. 1 is a graph of the value of the division ratio M/m during phase jumps of the output signal of frequency f2.

FIG. 2 diagrammatically shows the connection circuit of the means used in the device according to the invention.

FIG. 3 is the connection circuit of FIG. 2 in a preferred embodiment of the invention.

FIG. 4 is a mimic diagram of the device according to the invention in its preferred embodiment.

FIG. 5 is an operating diagram of the device according to the invention in a particular frequency analysis application.

DETAILED DESCRIPTION OF THE EMBODIMENTS

The frequency dividing device according to the invention makes use of the previously described, known cycle stealing process. This device in particular incorporates means for choosing the cycles to be concealed or masked in the input signal of frequency f1, in order to obtain an output signal of frequency f2 in an approximately regular form, i.e. an output signal having minimum amplitude phase jumps.

FIG. 1 is a graph with respect to the value of the division ratio M/m during phase jumps on the output signal of frequency f2. In said graphical representation, on the abscissa is plotted the phase of the input signal of frequency f1 and on the ordinate the phase of the output signal f2. Curve c in FIG. 1 shows the evolution of the instantaneous value of the division ratio M/m during phase jumps on the output signal of frequency f2. Line D in FIG. 1 shows the instantaneous value of the same division ratio M/m in the case when there is no phase jump. Curve C representing the value of the division ratio M/m in the case of the cycle stealing division process is a broken line. The phase jumps of the output signal of frequency f2 are represented by each break in the line and the more the broken line moves away from the mean line D and the higher the amplitude of the phase jumps, the gradient of said mean line D representing the sought division ratio.

Thus, the invention aims to approach, by a broken line like curve C, a line D of gradient M/m, so as to permit the choice of the cycles to be concealed in the input signal of frequency f1. This approach of the line D by the broken line C is obtained with the aid of an iterative algorithm which permits a continuously regulatable division ratio M/m and a minimum phase jump amplitude.

The device according to the invention is a sequential device, whose state varies for each period or cycle of the input signal of frequency f1, in accordance with an iterative function and according to an iterative data item stored during the preceding period. This device uses an iterative calculation with the aid of electronic, programmed, cabled, sequential logic functions provided by the electronics industry in the form of specific components.

FIG. 2 shows the connection circuit of the means used by the device according to the invention. This diagram shows the different means forming the frequency divider according to the invention and their links with one another.

Therefore an iterative function is implemented by this device and has as iterative values . . . , $R_i$, $R_{i+1}$, . . . with $1 \leq i \leq w$. These iterative values $R_i$ are stored in the storage means 1.

For the remainder of the description, it will be considered that the processing performed by the device according to the invention takes place on the iterative value $R_i$, but it being obvious that the processing successively takes place on the values $R_1$ to $R_w$.

Thus, the value stored in the storage means 1 is the value $R_i$, said means having an input e1b able to receive each of the iterative values . . . , $R_{i+1}$, $R_{i+2}$, . . . These means also have an input e1a connected to the output of the shaping means 10, which receive a signal of frequency f1 and supply to the storage means 1 a logic signal of frequency f1. These shaping means 10 can e.g. be constituted by a level comparator if f1 is the frequency of an electric signal.

This frequency f1 times the iteration index i of the iterative values $R_i$. The output s1 of these storage means 1 is connected to the input e3 of the determination means 3 for the binary information I, and to the input e7a of the adder 7 (also called adder circuit). These means 3 for the determination of the binary information I consequently receive by their input e3 the iterative value $R_i$. They incorporate a logic circuit able to determine the polarity sign of the iterative value $R_i$, i.e. the sign + or − preceding the value $R_i$. These determination means 3 are also able to convert the thus determined polarity sign into an information I written in binary form. As this information I is binary, it can assume a first state 0 or a second state 1.

This binary information I is then introduced into the means 4 for determining the frequency f2 by the input e4 connected to the output s3 of the means 3 for determining the sign of $R_i$. These means 4 for the determination of f2 are able to extract the value of the frequency f2 from the binary information I. More specifically, the means 4 for determining the frequency f2 seek the frequency at which the binary information I returns to the same state following a change of state. According to an embodiment of the invention, these means 4 for determining the frequency f2 can be in the form of a level translator-type logic circuit. These means 4 for determining the frequency f2 and the means 3 for determining the polarity sign form the information determination means 2.

The binary information I is then introduced into arithmetic means 5 by the input e6a connected to the output s3 of the determination means 3. More specifically, the binary information I is introduced by the input e6a into the conditional operation means 6, which also have an input e6b by which is introduced the value M and an input e6c by which is introduced the value m. These values M and m are parametrized values chosen by the user of the device and whose ratio M/m corresponds to the division ratio of the device according to the invention. The values Ri, m and M are digital values signed by a polarity sign +or –, said values RI, m and M consequently being able to be positive or negative and are coded in binary words of n bits. One or more arithmetic operations can therefore be performed on these values m, M and Ri as a function of the state of the binary information I. In addition, the value M/m is a parametrized value and can therefore be modified by the user of the device. In general terms, each of the values m and M are parameters applied to the device by the user thereof or by automatic means not described here. However, particularly embodiments can be envisaged and will be described in greater detail hereinafter.

Thus, the conditional operation means 6 perform a first operation or a second operation as a function of the state of the binary information I received at the input e6a. When the information I is in its state 1, this means that the iterative value Ri is positive or zero and then the conditional operation means perform, by means of a subtracter, a subtraction between the value m and the value M and supply the value m-M on their output s6. However, when the binary information I is in its state 0, which means that the iterative value Ri is negative, the conditional operation means 6 restore the value m at the outputs s6 of the conditional operation means 6. According to a special embodiment of the device, a selector (not shown in the drawing for simplification reasons) is connected by its output to the input e6b of the conditional operation means 6 and receives at the inputs on the one hand the value M and on the other the value 0. It ensures the selection of the operation to be performed by supplying one or other of these values to the circuit able to perform the subtraction.

Thus, according to the state of the information I, the result data obtained at the output s6 of the conditional operation means 6 is equivalent to m or to m-M. The result data is introduced by the input e7b into the adder 7. The latter also receives the iterative value Ri from the storage means 1 and introduced into the adder 7 by its input e7a. This adder 7 forms the sum between the iterative value Ri received and the value m or m-M. The result obtained at the output s7 of said adder 7 corresponds to the following iterative value Ri+1, i.e. the iterative value corresponding to the following cycle of the signal of frequency f1. This iterative value Ri+1 is introduced into the storage means 1 in the following cycle of the logic signal of frequency f1.

According to a first special embodiment of the invention, the arithmetic operation means 5 also have an inverter making it possible to modify the polarity sign of the parametrized value M. In this way, a value –M is introduced into the conditional operation means 6. The latter then have an adder ensuring the addition of m and –M when the binary information I appears at the input e6a in its state 1. This embodiment makes it possible to simplify the logic circuit of the conditional operation means 6 by the use of an adder in place of a subtracter, as proposed in the main embodiment of the invention.

According to a second special embodiment of the invention, it is possible to choose for the value M a particular preset number, the division ratio M/m remaining a parametrized value because the value m is a parametrized value chosen by the user. More specifically, in this case, the value M is preset by the device designer in such a way that the signed binary transcription of the value –M only has 0 for the bits of its absolute part and a bit at 1 for the sign bit. The value of M is then equivalent to $2^{(n-1)}$, in which n is the total number of bits of the binary transcription (this total number of bits including the sign bit).

According to this embodiment, the conditional operation means 6 consist of a simple logic combination of signs: m is always chosen positive and its sign bit is 0. This sign of the result data obtained at the output s6 is 1 (i.e. the sign of –M) when the binary information I received at the input e6a is in its state 1. The sign of the result data obtained at the output s6 is 0 when the binary information I is received in its state 0. Definitively, the sign of the result data is always equal to the information I and the absolute part of the result data corresponds to the absolute value of m. In this embodiment, it is thus possible to obtain the conditional operation means 6 by wiring only.

According to this embodiment, abstraction takes place of the particular value M, which is implicit in the conditional operation means 6. It is necessary for the information I to correspond to the inverse of the sign bit Ri. In addition, the means 3 for determining the information I incorporate an inverter.

According to a third special embodiment of the invention, the frequency dividing device according to the invention can have a frequency divider of ratio K, in which K is an integer. Such a frequency divider of ratio K can be a divider like the counting-based dividing devices known from the prior art. This frequency divider is connected to the output s4 of the means 4 for determining the frequency f2. This embodiment is shown in FIG. 3 described in greater detail hereinafter. Such a frequency divider of ratio K, associated in series with the frequency divider of ratio M/m permits a greater accuracy with respect to the sought division ratio. Thus, the division ratio between the frequency f1 and the frequency f2' being (M×K)/m, it is possible to increase the value of m whilst maintaining an identical division ratio because K is also increased, which makes it possible to obtain a larger number of significant bits. The division ratio between the frequency f1 and the frequency f2' obtained at the output of the frequency divider by K is then (M×K)/m.

FIG. 3 shows the frequency divider according to the invention in the third embodiment. Thus, FIG. 3 shows the means 1 for storing the iterative value Ri and the shaping means 10 supplying a logic signal of frequency f1 to the storage means 1. FIG. 3 also shows the means 3 for determining the binary information I connected by their output s3 to the input e6a of the conditional operation means 6 in order to transmit to the latter the binary information I determined by the means 3 for determining the binary information I. The conditional operation means 6 have a substantially identical function to that described relative to FIG. 2. They can be designed in accordance with any of the embodiments described relative to FIG. 2 and in particular according to that in which m is parametrized and M is preset (cf. FIG. 3). These conditional operation means 6 consequently only have two inputs, namely the input e6a from the means 3 for determining the information I and receiving the binary information I and the input e6c introducing the value m, the value M being implicit and equal to $2^{(n-1)}$. As in FIG. 2, the output s6 of the conditional operation means 6 is connected to the input e7b of the adder 7.

FIG. 3 also shows the third special embodiment described, namely that in which the device according to the invention comprises a frequency divider by K, in which K is an integer. Thus, the output s3 of the information determination means 3 is connected to the input e4 of the means 4 for determining the frequency f2. This frequency divider by K is designated 8 and receives on an input eSa the frequency f2 and on an input ebb the parametrized value K, and supplies on its output s8 the frequency f2'. The division ratio between the 10 frequency f1 of the input signal and the frequency f2' of the output signal according to the embodiment of FIG. 3 is $(2^{(n-1)} \times K)/m$.

FIG. 4 is a mimic diagram of the embodiment of FIG. 3. FIG. 4 shows the storage register 1, namely the means for storing the iterative value Ri, the adder 7 and the divider by K 8. FIG. 4 shows in mixed line form the means 4 for determining the frequency f2 and the conditional operating means 6, said means being shown in mixed lines because they are produced by simple connections, particularly the binary information I is directly connected in place of the sign bit of m, the input e4 and output s4 of the means 4 coinciding. Between the different means shown in FIG. 4 there are also data buses introducing into the device according to the invention the different data necessary for its implementation. The data bus B1 introduces the value m into the adder 7 with, as the sign bit, the value of I corresponding to the inverse of the sign of Ri. The data bus B2 introduces the iterative value Ri into the adder 7. The data bus B3 introduces the new iterative value Ri+1 determined by the adder 7 into the storage register 1. The connection wire 11 applies the signal of frequency f1 to the storage register 1. The connection wire 12 ensures the electrical connection between the output of the storage register 1 and the input of the inverter 3. The links 13, 14 and 15 connect the output of the inverter 3 to the means 4 for determining the frequency f2 on the one hand and to the conditional operation means 6 on the other. More specifically, the link 15 replaces the link relative to the sign bit of m within the data bus B1. The bus B4 makes it possible to introduce the parametrized value K into the divider 8. The connection wire 16 ensures the electrical connection between the means 4 for determining the frequency f2 and the divider by K 8. Finally, the connection wire 17 ensures the exit of the output signal of frequency f2' supplied by the divider by K 8.

The frequency divider according to the invention can be applied to numerous types of frequency analysis devices.

According to a first special embodiment, the frequency divider according to the invention can be used for performing a frequency analysis on signals having frequencies of different ranges, associated with the same analysis device, e.g. a frequency meter only having a single, frequency-reduced operating range, by dividing prior to the frequency analysis, the frequencies which are too high for the analysis device.

According to a second special embodiment, the frequency divider according to the invention can make it possible to check or measure the proportionality between the signals of frequency f3 and f4, i.e. check or obtain the equivalence f4=f3/N, in which N is the division ratio equivalent to (M×K)/n as described hereinbefore, where M can assume as the value $2^{(n-1)}$. In practice, the equivalence f4=f3/N can be translated by the result of a phase comparator connected to the signals of frequency f4 and f3/N, the division ratio N being adjusted by the user or by an autonomous process by acting on the parameter m applied to the frequency divider according to the invention.

According to a third special embodiment, the frequency divider according to the invention can permit the production of a frequency meter, whose resultant measurement is a digital data item. Such a frequency measuring device performs, according to the second, previously described embodiment, a proportionality measurement between a reference signal of frequency f3 and an incident signal of frequency f4, which is the object of the frequency measurement. The division ratio N=(M×K)/m is adjusted autonomously within the frequency measuring device by action on the parameter m applied to the frequency divider acting on the reference frequency f3. This requires a phase comparator acting on the signals of frequency f4 and f3/N and means for synthesizing the parameter m. In practice, the means for synthesizing the parameter m e.g. comprise an up/down counter and combinational logic circuits able to control said counter as a function of the result from the phase comparator so as to obtain at the output of the comparator the equivalence f4=f3/N, in which N is the division ratio equivalent to (M×K)/m, as explained hereinbefore, and in which M can assume the value $2^{((n-1)}$. From said equivalence can be deduced the measurement relation of the frequency f4=m= [(M×K)/f3]×f4, in which the quantity (M×K)/f3 represents the conversion factor of the frequency meter between the measured frequency and the digital data item m resulting from the measurement.

Such a device is shown in FIG. 5, where the reference 10 designates the time base supplying the frequency f3 to the input e11a of the frequency divider 11 according to the invention. The output s 11 of the frequency divider 11 supplies an intermediate frequency f3/N, which is introduced into a phase comparator 12 by its input e12a. Apart from the intermediate frequency f3/N introduced into the phase comparator 12, a frequency f4 is supplied to said comparator 12 by its input e12b. The result obtained at the output s12 of said comparator 12 is introduced into the means 14 for the synthesis of m by an input e14. The value of m obtained at the output s14 is then introduced into the frequency divider 11 by its input e11b, which permits the updating of the division ratio (M×K)/m. The value m is supplied at the output of the device and corresponds to the frequency f4 to within a conversion factor.

More specifically, the device according to the invention can be used for the frequency analysis of an output signal of a nuclear resonance magnetometer by choosing the parameters M and K and the reference frequency f3 in such a way as to obtain the adequate conversion factor, the parametric value m being expressed in nanotesla. Thus, in connection with magnetic field measurements, resonance scalar magnetometers measure the intensity of the magnetic field in which they are immersed by supplying a periodic signal. The conversion factor between the magnetic field and the frequency from a nuclear resonance magnetometer is 23.4874 nanotesla/hertz with a limitation to the fourth decimal place.

I claim:

1. Device for dividing an electric signal of frequency f1 by a ratio in order to supply an electric signal of frequency f2, in which the frequency f2 is below the frequency f1, characterized in that it comprises:

a shaping means (10) receiving a signal of frequency f1 and able to emit a logic periodic signal at said frequency f1, a means (1) for storing iterative values ( Ri, Ri+1, . . . ) having a first input (e1a) connected to the shaping means in order to receive the periodic signal emitted at the frequency f1, a information determination means (2) having an input (e3) connected to an output (s1) of the storage means for receiving the iterative value Ri stored in said storage means, said determination means being able, on the one hand, to determine the polarity sign of the interactive value and convert said polarity sign into a binary information (I) which can be in a first or second state, said information being supplied to a first output (s3) and, on the other hand, determine a frequency signal (f2) on the basis of this information relative to the iterative value, a arithmetic means (5) comprising a conditional operation circuit (6) able to receive on a first input (e6a) connected to the first output of the determination means, the said binary information, on a second input the value m having an associated sign and able to supply on an output, either the value m-M, or the value m as a function of the binary information state, where M is a value known by said conditional operation circuit, and an adder circuit able to receive on a fourth input (e7b) connected to the output of the storage means, the iterative value and on a fifth input connected to the output of the conditional operation circuit the value m-M or m, and supply for each period of the frequency signal a new iterative value (Ri+1) transmitted to the storage means by an output (s7) connected to a second input (e1b) of said storage means.

2. Device according to claim 1, characterized in that the information determination means incorporate a first logic circuit (3) able to determine the polarity sign of the iterative value and convert said polarity sign into a binary information (I).

3. Device according to claim 2, characterized in that the determination means incorporate a second logic circuit (4) able to determine the frequency at which the binary information is in its first state, said frequency corresponding to the frequency (f2).

4. Device according to claim 1, characterized in that the ratio is equal to M/m and is a parametrized value, in which each of the values M and m are parametrized values, the value m being introduced onto the second input of the conditional operation circuit and the value M being introduced onto a third input of said conditional operation circuit.

5. Device according to claim 1, characterized in that the ratio is equal to M/m and is a parametrized value, in which m is a parametrized value introduced onto the second input of the conditional operation circuit and M is a particular value preset in the conditional operation circuit.

6. Device according to claim 5, characterized in that the conditional operation circuit comprises a circuit able to select, as a function of the binary information (I), the modification or non-modification of the sign of m in order to supply at the output of the conditional operation circuit, the value of m with an optionally modified sign.

7. Device according to claim 1, characterized in that the conditional operation circuit comprises a circuit able to perform a subtraction of the values m and M.

8. Device according to claim 1, characterized in that it comprises a frequency dividing circuit (8) having an input connected to the output of the determination means and ensuring a division of the frequency f2, obtained at the output of said determination means, by an integer K in order to have a division ratio equal to (M×K)/m.

9. Device for measuring a frequency f4 from the relation m=×f4 in which N=(M×K)/f3 is a conversion factor between the measured frequency f4 and a digital data item m, said device including a frequency divider circuit comprising:

a shaping means (10) receiving said signal of frequency f3 and able to emit a logic periodic signal at said frequency f3, a means (1) for storing iterative values (. . . Ri, Ri+1, . . . ) having a first input (e14) connected to the shaping means in order to receive the periodic signal emitted at the frequency f3.

a information determination means (2) having an input (e3) connected to an output(s1) of the storage means for receiving the iterative value Ri stored in said storage means, said determination means being able, on the one hand, to determine the polarity sign of the interactive value and convert said polarity sign into a binary information (I) which can be in a first or second state, said information being supplied to a first output (s3), and, on the other hand, determine a frequency signal (f3/N) on the basis of this information relative to the iterative value, a arithmetic means (5) comprising a conditional operation circuit (6) able to receive on a first input (e6a) connected to the first output of the determination means, the said binary information, on a second input said digital item m and able to supply on an output, either the value m-M, or said digital item m as a function of the binary information state, where M is a value known by the said conditional operation circuit; and an adder circuit able to receive on a fourth input (e7b) connected to the output of the storage means, the iterative value and on a fifth input connected to the output of the conditional operation circuit the value m-M or said digital item n, and supply for each period of the frequency signal a new iterative value (Ri+1) transmitted to the storage means by an output (s7) connected to a second input (e1b) of said storage means.

* * * * *